United States Patent [19]
Lin et al.

[11] Patent Number: 5,646,071
[45] Date of Patent: Jul. 8, 1997

[54] EQUIPMENT AND METHOD FOR APPLYING A LIQUID LAYER

[75] Inventors: Ting-Hwang Lin, Shin Chu; Shih-Ming Wang, Kaohsiung; Li-Chum Chen, Hsin-chu, all of Taiwan

[73] Assignee: Taiwan Semiconductor Manufacturing Company, Ltd., Hsin-Chu, Taiwan

[21] Appl. No.: 374,856

[22] Filed: Jan. 19, 1995

[51] Int. Cl.$^6$ .................... H01L 21/465; B05D 3/12
[52] U.S. Cl. .................... 437/228; 427/96; 427/240; 427/385.5; 437/231; 437/235; 437/245
[58] Field of Search ............ 427/240, 96, 126.2, 427/126.3, 385.5; 437/231, 228, 235, 245; 118/52

[56] References Cited

U.S. PATENT DOCUMENTS

| | | | |
|---|---|---|---|
| 4,393,807 | 7/1983 | Fujimura et al. | 427/240 |
| 4,550,679 | 11/1985 | Pipa et al. | 427/240 |
| 4,668,334 | 5/1987 | Doornveld | 427/240 |
| 5,001,084 | 3/1991 | Kawai et al. | 437/231 |
| 5,328,871 | 7/1994 | Tanigawa et al. | 437/231 |

*Primary Examiner*—Janyce Bell
*Attorney, Agent, or Firm*—George O. Saile

[57] ABSTRACT

A method and apparatus for applying a liquid to the surface of semiconductor wafer are described. The wafer is rotated about an axis; perpendicular to its main surface. Liquid is dispensed onto the surface of the spinning wafer from at least two dispensing bottles. One of the dispensing bottles is positioned above the center of rotation while the others are located between it and the wafer's edge. The rate at which liquid emerges from each of the dispensing bottles is independently controlled for each bottle.

16 Claims, 3 Drawing Sheets

EQUIPMENT AND METHOD FOR APPLYING A LIQUID LAYER

BACKGROUND OF THE INVENTION

(1) Field of the Invention

The invention relates to the general field of integrated circuits and more particularly to the problem of applying a liquid layer to the surface of a relatively large silicon wafer in reasonable time and with reasonable uniformity.

(2) Description of the Prior Art

In the course of manufacturing an integrated circuit, many solid layers get deposited, one on top of another. It is also necessary sometimes to deposit a liquid layer such as photoresist solution or a solution of an uncured spin-on-glass. A commonly used method for accomplishing this is to spin the integrated circuit about an axis perpendicular to its main surface and to then drip one or more drops of the liquid onto the surface. Centrifugal force then spreads the liquid out, producing a uniform layer. As the silicon wafers from which integrated circuits are fashioned grow larger, this method begins to run into difficulty. In particular, there is a tendency for the thickness of the liquid layer near the outer edges to be thinner than desired.

This problem has been largely solved by the method and apparatus of the present invention. Instead of dispensing the liquid onto the spinning surface from a single source, located above the center of rotation, multiple sources, spaced at varying distances from the center of rotation, are used.

An apparatus and method involving two nozzles dispensing liquid onto a rotating substrate has been described by A. Kawai and S. Uoya in U.S. Pat. No. 5,001,084 (Mar. 19, 1991) but it is key to their invention that the nozzles dispense different liquids. The nozzle located over the center of rotation is used to dispense the liquid that is desired as the end product while the second nozzle is used to dispense a cleaning fluid. To practice their invention, the cleaning fluid is first dispensed and, only after it is no longer present on the spinning surface, is the other liquid dispensed from the central nozzle. Thus, as far as thickness distribution is concerned, this method suffers the same disadvantages as the prior art.

It is also clear that U.S. Pat. No. 5,001,084 is limited to two nozzles or, at best, an even number of nozzles, a limitation to which the present invention is not subject.

SUMMARY OF THE INVENTION

It is an object of this invention to provide an apparatus and method for applying a liquid layer of uniform thickness to the surface of a semiconductor wafer as part of the process of manufacturing an integrated circuit. It is a further object of the invention to minimize the time required to apply the layer and to limit the amount of liquid wasted while doing so.

In accordance with the present invention, the semiconductor wafer is caused to rotate about an axis that is perpendicular to its main surface. Liquid is then dripped onto the surface of the spinning wafer from at least two dispensing bottles. One of the dispensing bottles is positioned above the center of rotation of the wafer while the other bottle or bottles are located above the wafer between the center of rotation and the wafer's edge. The rate at which fluid is dripped from the dispensing bottles is independently controlled for each bottle.

DESCRIPTION OF THE PREFERRED EMBODIMENTS

Figure 1:
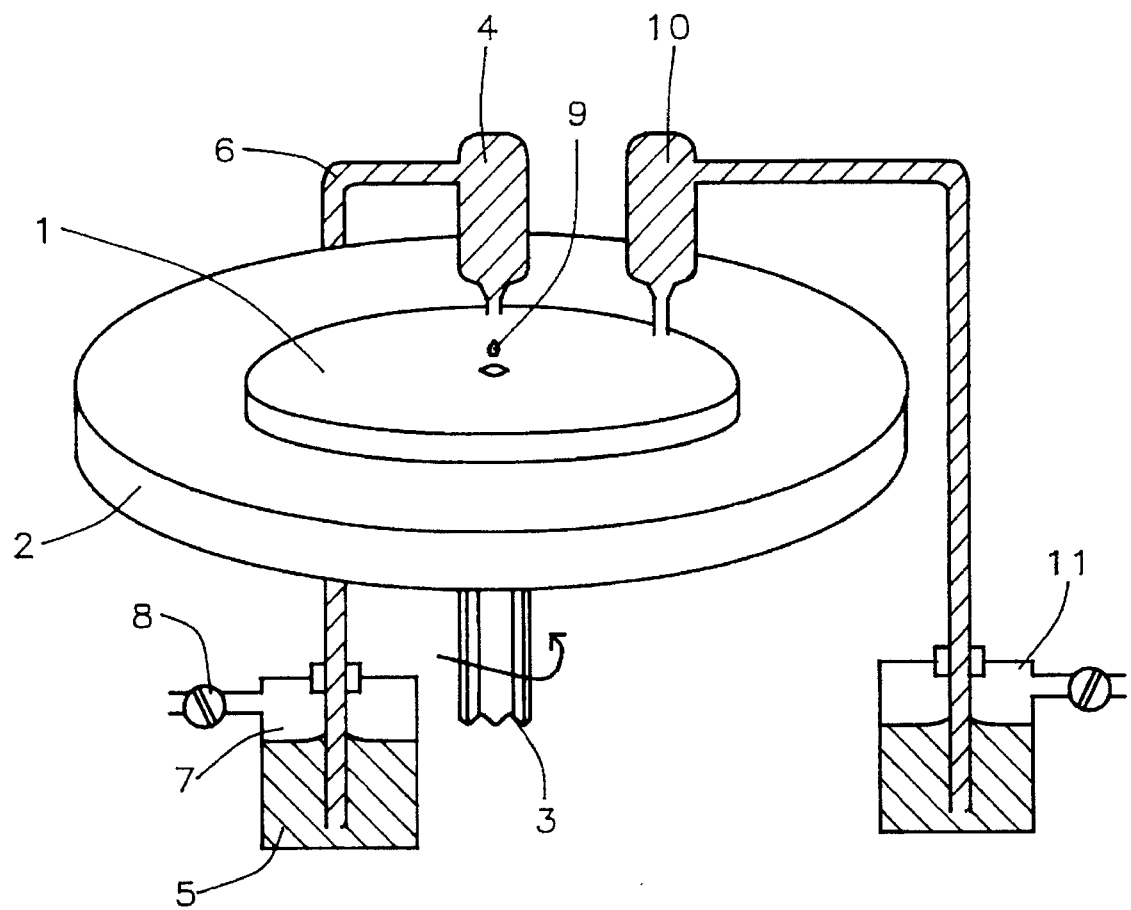
FIG. 1 is a schematic illustration of an apparatus for applying a liquid layer in accordance with the present invention.

As part of the process of manufacturing an integrated circuit, there are one or more steps that involve the laying down of a liquid layer on the surface of the semiconductor wafer from which the integrated circuit is being fashioned. Examples of such liquids are solutions of photoresist and uncured spin-on-glasses. Generally, once such liquids have been applied to the wafer surface, they must be allowed to dry before the next processing step can take place.

The preferred method for applying a liquid to the surface of a semiconductor wafer has been to spin the wafer at a moderately high rate of rotation (typically less than about 6,000 revolutions per minute) and to then allow one or more drops of the liquid that is being applied to fall onto the spinning wafer, the point of application being the axis of rotation of the wafer. As the liquid drop lands on the surface of the spinning wafer, it spreads out, partly through gravitational action, but mainly because of centrifugal force. If sufficient liquid is applied at the center, liquid will eventually spread all the way to the wafer's edges to form a reasonably uniform layer over the surface of the entire wafer.

Several factors influence the thickness and uniformity of a liquid film that was applied as described above. Two of these factors (in addition to the speed of rotation during application) are the viscosity of the liquid and the time that it takes a freshly applied layer to dry. Thus, for example, it has been found as a matter of experience that, in the case of a relatively viscous liquid with a relatively short drying time, the liquid may dry before it has had time to spread all the way to the edge of the wafer. An even more serious problem arises if the liquid does in fact reach the edge of the wafer but, because of premature drying, is substantially thinner at the wafer's edge than closer to its center. A non-uniform thickness distribution of this type is not easy to detect without careful inspection so that, in practice, it leads to an edge deficit problem. For example, if the liquid happens to be a solution of uncured spin-on-glass (SOG), more than enough SOG may be applied to cover the center region of the wafer and yet be insufficient to cover the edge region (thus leading to incomplete planarization—the purpose for which the SOG was applied in the first place).

Another factor that influences (primarily) the thickness of the liquid film is the amount of liquid that is applied to the surface of the spinning wafer. The preferred method for controlling this part of the process is to store the liquid in a small dispensing bottle that is positioned a short distance above the surface of the wafer (typically less than about 2 inches). The end of the dispensing bottle that is closest to the wafer terminates in a narrow nozzle (minimum diameter typically less than about 0.5 inches) through which the liquid is caused to flow slowly enough to allow its application to the wafer surface in the form of one or more droplets whose number and frequency of emergence from the nozzle are carefully controlled.

The method described above works well enough for relatively small diameter wafers (less than about 6 inches), but as the wafer diameters grow larger the edge deficit problem, also alluded to above, becomes increasingly more serious. It has therefore been an object of the present invention to develop a method and an apparatus that will allow a liquid film of substantially uniform thickness to be applied to the surface of a semiconductor wafer, regardless of its diameter.

Referring now to FIG. 1, the semiconductor wafer 1 is securely mounted in the approximate center of the turntable 2. Any method of mounting (such as a vacuum chuck) may be used as long as it holds the wafer securely in place during the spinning operation without at the same time damaging the wafer in any way. Using an appropriate means 3, (not shown here but which could be, for example, an electric motor) the turntable and wafer are rotated at speeds up to about 5,000 r.p.m. A dispenser bottle 4 containing the liquid that is to be applied is positioned above the center of rotation of the turntable with the nozzle pointing downward. One or more drops of the liquid may then be dripped onto the wafer surface, under careful control.

Control of liquid flow through the nozzle is accomplished by connecting the dispensing bottle to a larger reservoir of liquid 5 in sealed system 6 that is under pressure of a gas 7 that shares part of its volume. The pressure of the gas can be varied by standard means 8 (not described here but which could be, for example, a reducing valve placed between the reservoir and a tank of high pressure gas). As the gas pressure is increased the liquid will emerge from the dispensing nozzle at a faster rate, and vice versa. The preferred gas for providing the pressure has been helium, but any gas that does not interact with the liquid may be used.

Also shown in FIG. 1 is a drop of liquid 9 that has just emerged from the nozzle of dispensing bottle 4 and is falling towards the surface of the spinning wafer 1. A second dispensing bottle 10 is also shown in FIG. 1. In this illustration it has been positioned about half way between dispensing bottle 4 and the outer edge of semiconductor wafer 1, but its precise location relative to bottle 4 is not critical for the successful operation of the present invention. No drop is shown below the nozzle of bottle 10 although drops could be caused to emerge simultaneously from any or all the dispensing bottles, should the users of the apparatus so desire, since the flow from each dispensing bottle is independently controlled. In the case of dispensing bottle 10, for example, the flow of liquid is controlled by varying the gas pressure in reservoir 11.

Figure 2:
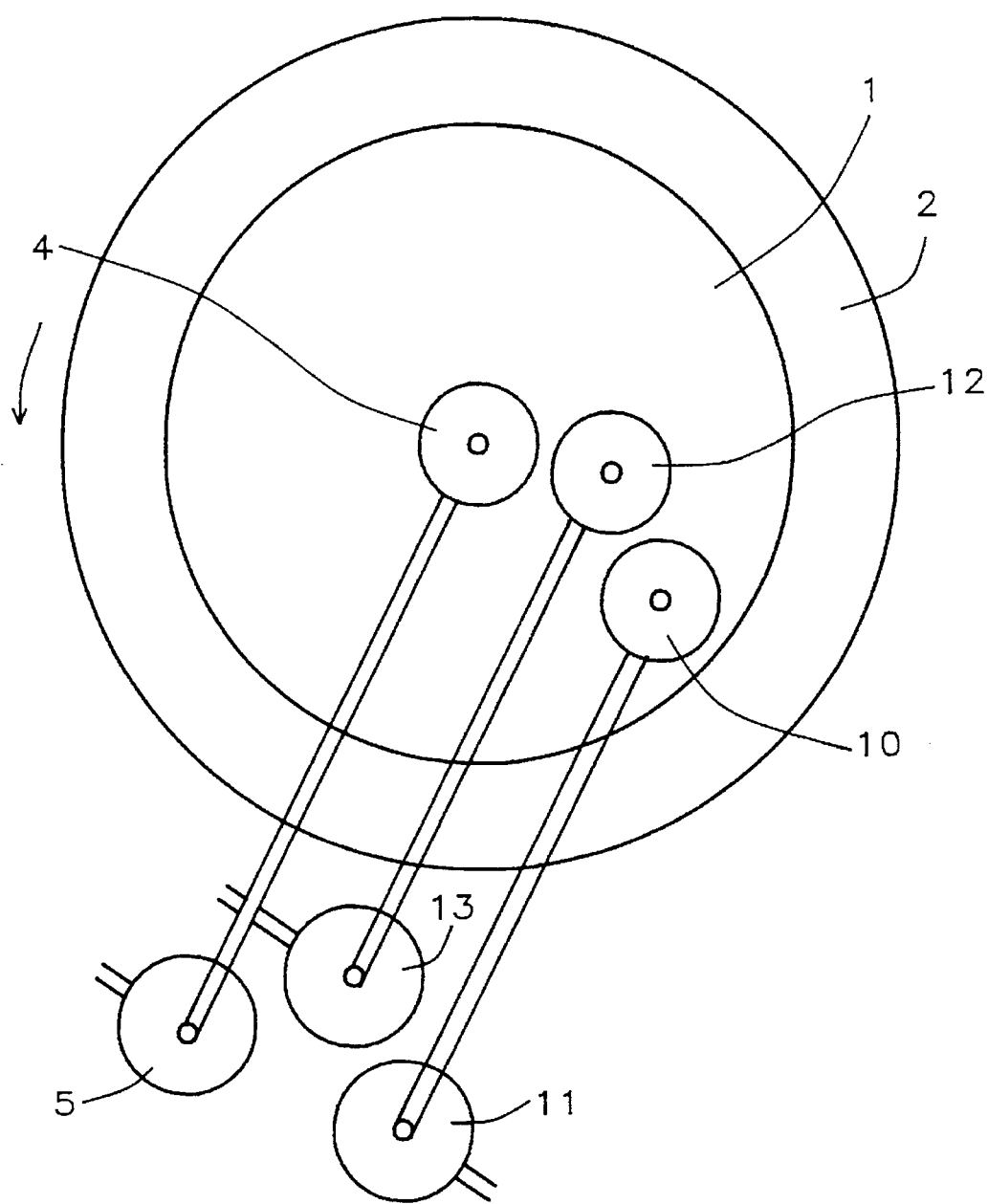
FIG. 2 is a plan view of another embodiment of the present invention.

FIG. 2 is a plan view of a second embodiment of the present invention. Shown is an apparatus that is essentially the same as that of FIG. 1, except that a third dispensing bottle 12 has been added. As with the other two dispensing bottles, 4 and 10, bottle 12 has its own flow control system 13. Should they be needed, additional dispensing bottles, together with their flow control systems, could be added to the apparatus without departing from the spirit and scope of the present invention. It can be seen that the three dispensing bottles, 4, 10, and 12, are not colinear. This illustrates the fact that it is not necessary for the nozzles of the various dispensing bottles to lie in a straight line, although they may do so should the users of the apparatus so desire.

Figure 3:
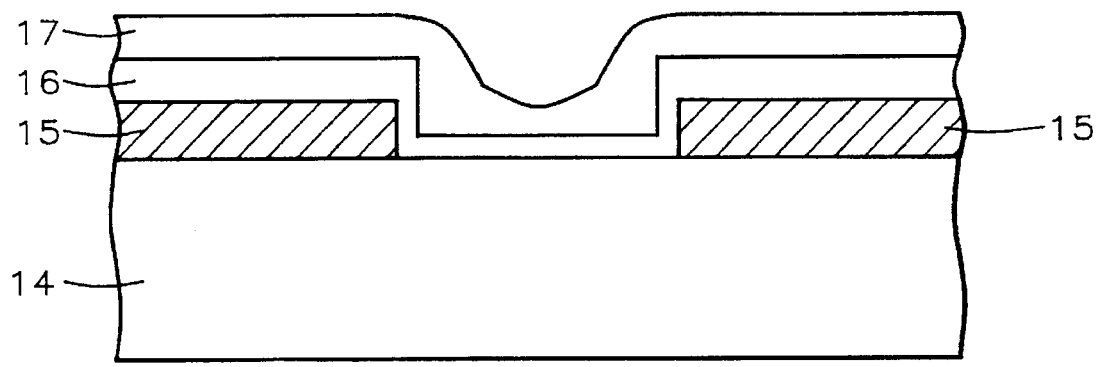
FIGS. 3 and 4 are schematic cross-sections through a portion of a partially manufactured integrated circuit.

FIG. 3 serves to illustrate the type of problem that was encountered prior to the development of the present invention. Shown is a schematic cross-section through a portion of a partially manufactured integrated circuit located near the outer edge of a silicon wafer. A metal layer 15 has been deposited onto the surface of the silicon wafer 14 and then etched into a suitable pattern, seen here as two lines viewed edge on. A layer 16 of an insulating material was then deposited and, as seen, layer 16 followed the contours of the surface. In order to return the surface to a condition of planarity prior to proceeding, a solution of an uncured spin-on-glass (SOG) was applied to the entire wafer by conventional means, i.e. by dripping the SOG solution onto the surface of the wafer from a single nozzle located over the wafer's axis of rotation. Because the SOG solution is relatively viscous and, in addition, takes only a short time to dry, once exposed to air, the intended amount of SOG did not reach the outer edges of the wafer. The result was that there was insufficient SOG, in those areas of the wafer, to achieve proper planarization.

In principle it is possible to deal with this problem (of SOG deficit at the edges in a single nozzle system) by the simple means of dispensing additional amounts of SOG solution. Such a technique, however, has several disadvantages. First, the time to apply an adequate liquid layer takes substantially longer in the single (as opposed to the multiple) nozzle system. Second, such an approach is hard to control and often leads to significant wastage of SOG material. In a manufacturing environment, process time and material costs are significant items in determining overall economic efficiency. It should also be noted that the disadvantages of the single nozzle system become increasingly more apparent as wafer diameters increase beyond 6 inches. For example, for a single nozzle system, the time needed to apply sufficient SOG solution rose from 2 seconds to 8 seconds when going from 6 inch diameter to 8 inch diameter wafers.

Figure 4:
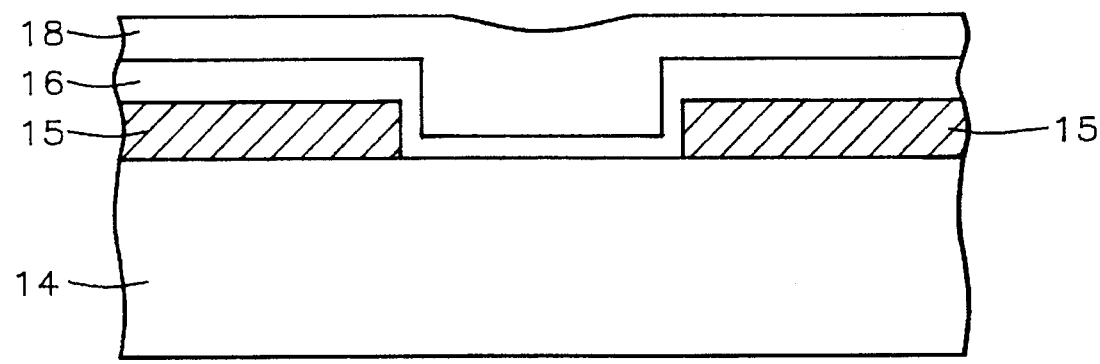

In FIG. 4 we illustrate the result of applying SOG solution to the surface of a large wafer using the method of the present invention. The section of the integrated circuit shown is the same as in FIG. 3 but, as can be seen, the properly applied SOG layer 18 has now achieved its intended purpose of planarizing the surface.

While the invention has been particularly shown and described with reference to the preferred embodiments thereof, it will be understood by those skilled in the art that various changes in form and details may be made without departing from the spirit and scope of the invention.

What is claimed is:

1. A method for applying a layer of a single liquid, having a viscosity and a drying time, to the surface of a semiconductor wafer, comprising:

providing the wafer with rotational speed;

applying the liquid to the surface of the wafer, while said wafer is being rotated, through at least two nozzles, said nozzles being positioned at some height above said turntable, with one of the nozzles being directly over the axis of rotation of said turntable; and for each nozzle independently, controlling the rate at which liquid emerges from the nozzles by means of applied gas pressure.

2. The method of claim 1 where the diameter of the semiconductor wafer is too large for liquid dispensed from a single source to be uniformly distributable.

3. The method of claim 1 where the liquid that is being applied is a solution of an uncured spin-on-glass.

4. The method of claim 1 where the diameter of the nozzles is less than about 0.5 inches.

5. The method of claim 1 where said height of the nozzles above the turntable is less than about 5 inches.

6. The method of claim 1 where said speed of rotation of the turntable is less than about 6,000 revolutions per minute.

7. The method of claim 1 where the viscosity of the liquid at the temperature at which it is being applied is between 0.5 and 5 centipoise.

8. The method of claim 1 where the drying time of the applied liquid is less than about 3 minutes.

9. The method of claim 1 where the gas pressure that is used to control the rate at which liquid emerges from the nozzles is less than about 2 kilograms per square centimeter.

10. The method of claim 1 where more than one coat of the liquid is applied to said semiconductor wafer.

11. A method for applying a liquid layer of a solution of uncured spin-on-glass to the surface of an integrated circuit, for the purpose of planarizing its surface, comprising:

depositing a layer of a conductive material onto the surface of a silicon body;

etching said layer of a conductive material into an appropriate pattern;

depositing a layer of an insulating material onto said etched layer of conductive material;

applying said solution of uncured spin-on-glass to the surface of said integrated circuit, while it is being provided with rotational speed, through at least two nozzles, said nozzles being positioned at some height above said integrated circuit, with one of the nozzles being directly over the axis of rotation; and for each nozzle independently, controlling the rate at which liquid emerges from the nozzles by means of applied gas pressure.

12. The method of claim 11 where the diameter of the nozzles is less than about 0.5 inches.

13. The method of claim 11 where said height of the nozzles above the integrated circuit is less than about 6 inches.

14. The method of claim 11 where said speed of rotation is less than about 6,000 revolutions per minute.

15. The method of claim 11 where the gas pressure that is used to control the rate at which liquid emerges from the nozzles is less than about 2 kilograms per square centimeter.

16. The method of claim 11 where more than one coating of spin-on-glass is applied to the surface of the integrated circuit.

* * * * *